United States Patent [19]

King et al.

[11] Patent Number: 5,177,366

[45] Date of Patent: Jan. 5, 1993

[54] ION BEAM IMPLANTER FOR PROVIDING CROSS PLANE FOCUSING

[75] Inventors: Monroe L. King; Jerald P. Dykstra, both of Austin, Tex.

[73] Assignee: Eaton Corporation, Cleveland, Ohio

[21] Appl. No.: 846,716

[22] Filed: Mar. 6, 1992

[51] Int. Cl.$^5$ .......................................... H01V 37/317
[52] U.S. Cl. .................................. 250/492.2; 250/398
[58] Field of Search .................. 250/492.2, 492.21, 398

[56] References Cited

U.S. PATENT DOCUMENTS

| 4,276,477 | 6/1981 | Enge | 250/398 |
| 4,687,936 | 8/1987 | McIntyre et al. | 250/397 |
| 4,794,305 | 12/1988 | Matsukawa | 315/111.81 |
| 4,922,106 | 5/1990 | Berrian et al. | 250/492.2 |
| 5,026,997 | 6/1991 | Benveniste | 250/492.2 |
| 5,091,655 | 2/1992 | Dykstra et al. | 250/492.2 |

Primary Examiner—Jack I. Berman

[57] ABSTRACT

An ion beam implantation system. An ion beam is controllably deflected from an initial trajectory as it passes through spaced parallel plates that are biased by a control circuit. Once deflected, the ion beam passes through electrodes positioned along a beam travel path that both redeflect the once-deflected ion beam and accelerate the ions to a desired final energy. Ions within the beam exit the accelerator and impact a workpiece at a uniform, controlled impact angle due to ion focusing in a scanning plane and an orthogonal cross plane.

16 Claims, 14 Drawing Sheets

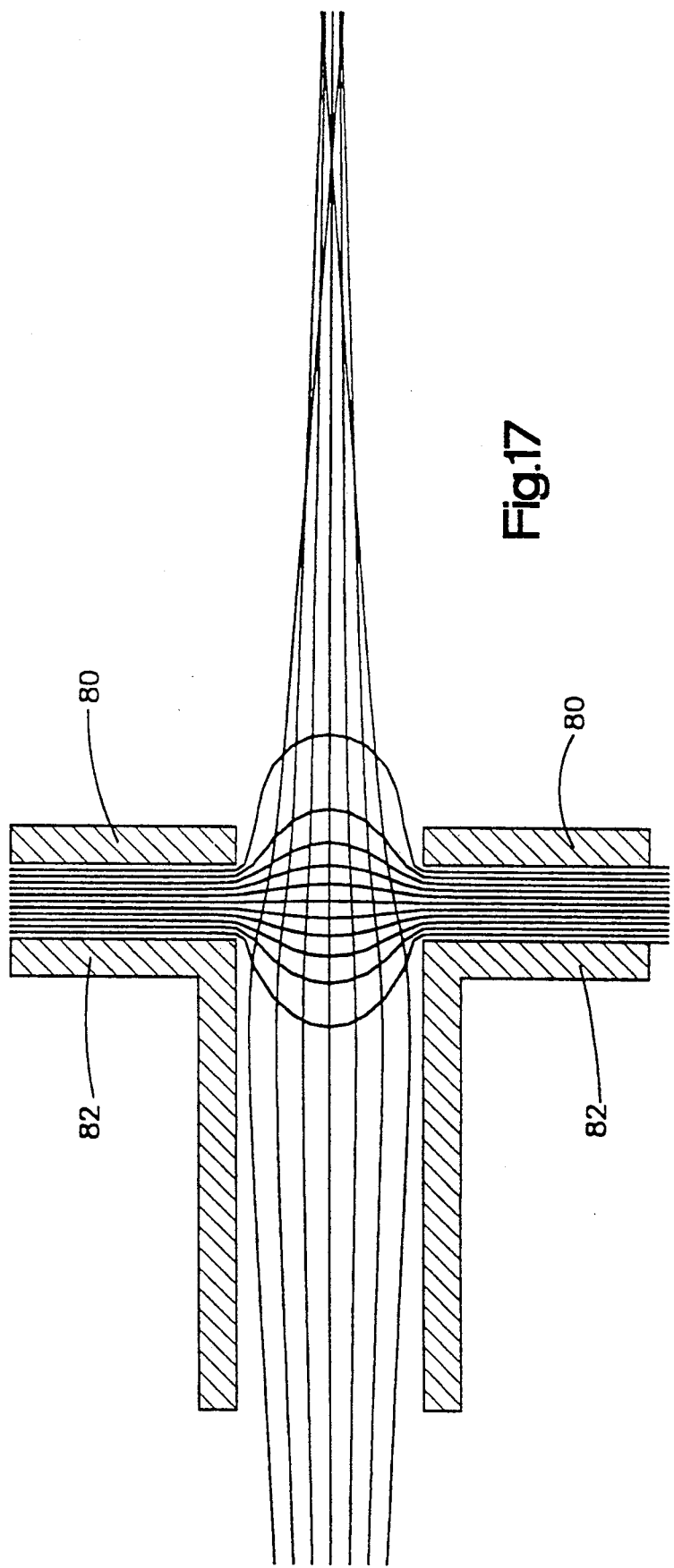

ION BEAM IMPLANTER FOR PROVIDING CROSS PLANE FOCUSING

FIELD OF THE INVENTION

The present invention concerns an ion implanter for treating workpieces and more specifically concerns an ion implanter that is particularly suited for implanting semiconductor wafers with doping impurities.

CROSS REFERENCE TO RELATED PATENTS

Commonly owned U.S. patent application Ser. No. 07/660,738, now U.S. Pat. No. 5,091,655 to Dykstra et al., discloses an ion implantation system for treating semi-conductor wafers and is incorporated herein by reference. The Dykstra et al. disclosure includes a focusing lens for maintaining uniform angle of impact between ions and a workpiece.

BACKGROUND ART

It is known in the semiconductor fabrication art to use an ion beam to dope semiconductor wafers with ion impurities. By scanning an ion beam across a wafer surface or moving the wafer through a stationary beam the wafer can be uniformly doped.

The angle at which an ion beam impacts a wafer surface (wafer tilt) is an important parameter in ion implantation of the wafer. Recent trends in semiconductor material processing require a greater range of wafer tilt capability, typically 0-60 degrees, while decreasing the variation of the ion impact angle across the wafer surface.

In a scanning ion beam system, electrostatic deflection plates produce a raster pattern of ion beam impingement on the wafer surface. One set of plates produces a rapid back and forth scan in one direction and a second set of plates provides beam deflection in an orthogonal direction. Such raster scanning results in impact angle variations of $\pm 4°$ of the central ray of the beam across a 200 mm wafer for a typical scanning ion beam geometry.

Methods have been proposed to reduce this impact angle variation. One proposal suggests using four sets of deflection plates, two horizontal and two vertical, and is referred to as a double deflection system. The beam is first deflected away from an initial trajectory and then, before striking the wafer, is deflected again to return to a direction parallel to its original, undeflected trajectory.

Use of a double deflection system with large wafer diameters requires deflection plates that are more widely spaced. This requires high deflection voltages that must be scanned and precisely synchronized with the scanning voltages applied to the first set of deflection plates. Another problem is that as the opening in the scan plates increases, electrostatic fringing fields become more difficult to control and become more susceptible to beam space charge effects.

Another known method of reducing tilt variations is to use a mechanically scanned, spinning disk wafer support. If the spin axis is parallel to the beam, no impact angle variations are present. Spinning disk supports have problems achieving control over impact angle while maintaining the necessary condition for an impact angle variation. One example of a prior art patent having a spinning workpiece support is U.S. Pat. No. 4,794,305 to Matsukawa.

Another more recent approach is to electrostatically scan the beam in one axis, and then use a highly indexed bending magnet to produce a parallel ribbon beam. The semiconductor wafer target is also scanned mechanically in a direction orthogonal to the ribbon beam to produce a uniform two dimensional implant. U.S. Pat. No. 4,276,477 to Enge, U.S. Pat. No. 4,687,936 to McIntyre et al. and U.S. Pat. No. 4,922,106 to Berrian et al. disclose such systems.

To define an ion beam used for implantation, one often refers to the median and range of impact angles for the beam against the workpiece. To help characterize the median and range, two orthogonal planes are defined; the parallelizing and the cross plane. The parallelizing plane is the plane seen from the top view of the lens in the '655 patent to Dykstra et al. and is also referred to as the scan plane since this is the plane in which the beam scans back and forth. The cross plane is seen as a section view through the lens that bisects the lens along the direction of beam travel.

DISCLOSURE OF THE INVENTION

The disclosed ion beam implant system treats a workpiece, typically a semi-conductor wafer, by causing ions to impact the wafer at a controlled, uniform angle in both the cross and the parallelizing planes.

Ions emitted by an ion source form an ion beam moving in a first trajectory. Ions move along this first trajectory to a magnet which preferentially deflects ions of the correct mass and charge along a second trajectory. An electrode pair deflects ions away from this second trajectory by a controlled amount to produce a side to side scan. A beam accelerator accelerates ions deflected by the controlled amount before they impact a workpiece. A control circuit having an output coupled to the side to side scan electrode pair adjusts the deflecting of the ion beam and thereby controls ion beam treatment of the workpiece.

The beam accelerator includes entrance electrodes biased at control voltages for creating a non-uniform electric field. In the disclosed and preferred design, first and second entrance electrodes form arcuate or curved conductive electrode surfaces having a slot or through-passage that passes through the first and second entrance electrode. The gap between electrodes, thickness of the electrodes, curvature of the electrodes, electrical potential of each, and slot dimensions can all be adjusted to control impact angle. The non-uniform electric field created by these electrodes preferably causes ions following diverse trajectories to be redeflected so they impact the workpiece at a relatively uniform angle. One or more additional electrodes accelerate or decelerate the ions after they have been redeflected so they impact the workpiece with an appropriate energy. These additional electrodes are only required if the desired beam energy is different that the sum of the energies imparted by an extraction power supply and a lens power supply.

The cross plane focusing imparted to a charged particle beam through a simple slotted acceleration gap is generally inversely proportional to the slot width and the gap length. It is proportional to the applied voltage and the angle at which the beam enters the slot. Shaping the electric fields near the slot by thickening the electrodes in which the slots are formed increases the cross plane focusing. The entrance electrode is more sensitive to the thickness change as the particles have lower energy at the entrance to the beam accelerator.

Variation of cross plane focusing in the ion beam increases if the beam enters the accelerator at a large input angle near the ends of the slot or throughpassage due to the side to side scanning. The gap-defining electrodes are curved to impart the parallelizing action described in U.S. Pat. No. 5,091,655 so that this angle is further increased.

In the parallelizing or scan plane, the bending angle is independent of the gap length and it has been found that if the gap length is varied across the width of the lens, the cross plane focusing variation with input angle is diminished.

The cross plane focusing near the center of the lens is increased by thickening the first curved electrode near the center and thinning it near the ends of the slots.

The above corrections to the cross plane focus do interact with the parallelizing or scan plane in a way that affects the parallelizing action. It appears, however, that a suitable compromise can be achieved for scanned beam ribbons of about 10 inches in width and for beam transport distances of about 18 inches from the scan electrodes.

Various objects, advantages and features of the invention will become better understood from the accompanying detailed description of one embodiment of the invention which is described in conjunction with the accompanying drawings.

BRIEF DESCRIPTION OF THE DRAWINGS

FIGS. 15–17 show variations in electrode construction to modify ion beam focusing in the cross plane.

BEST MODE FOR CARRYING OUT THE INVENTION

Figure 1A:
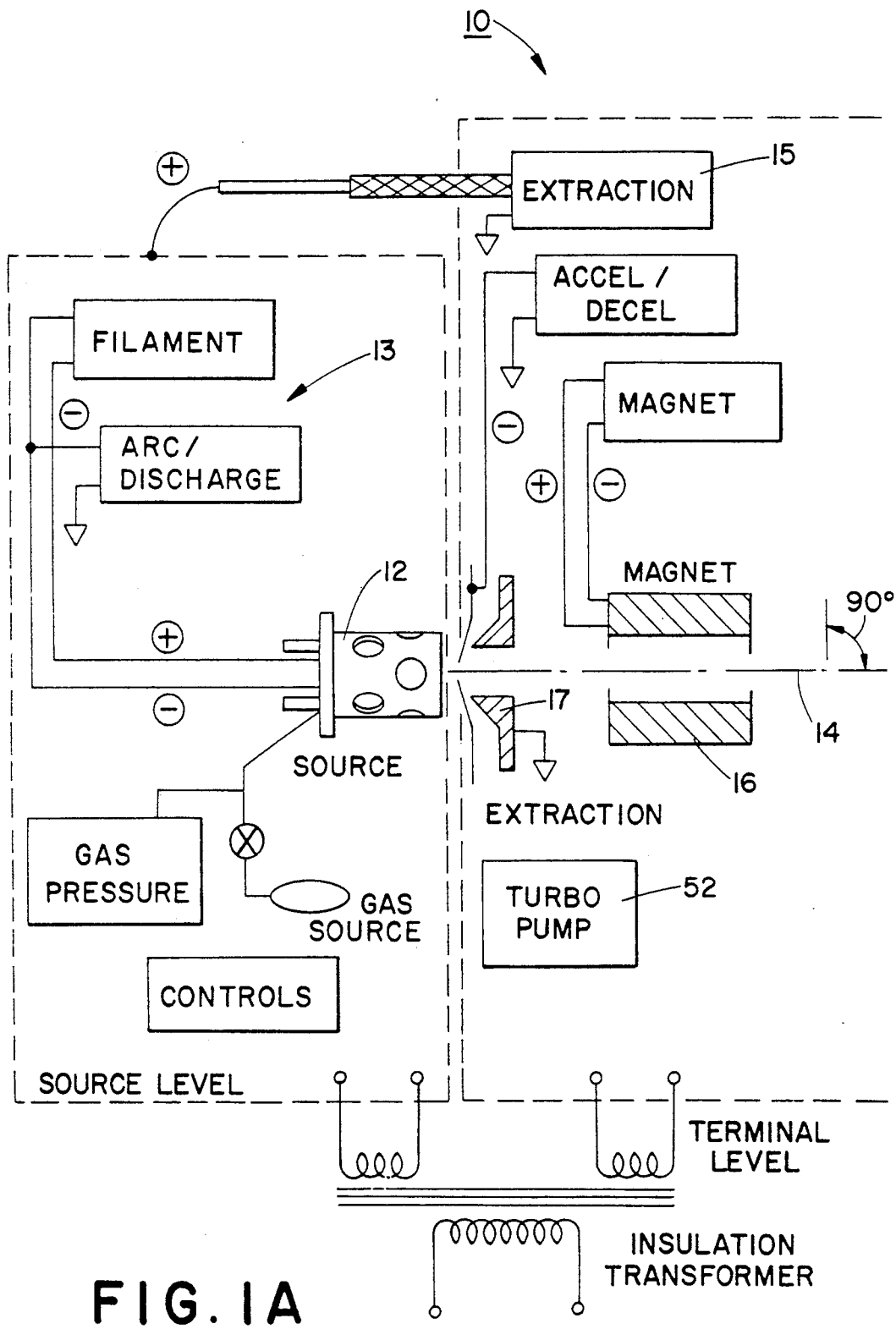
FIGS. 1A and 1B schematically depict an ion implantation system constructed in accordance with the invention.
Figure 1B:
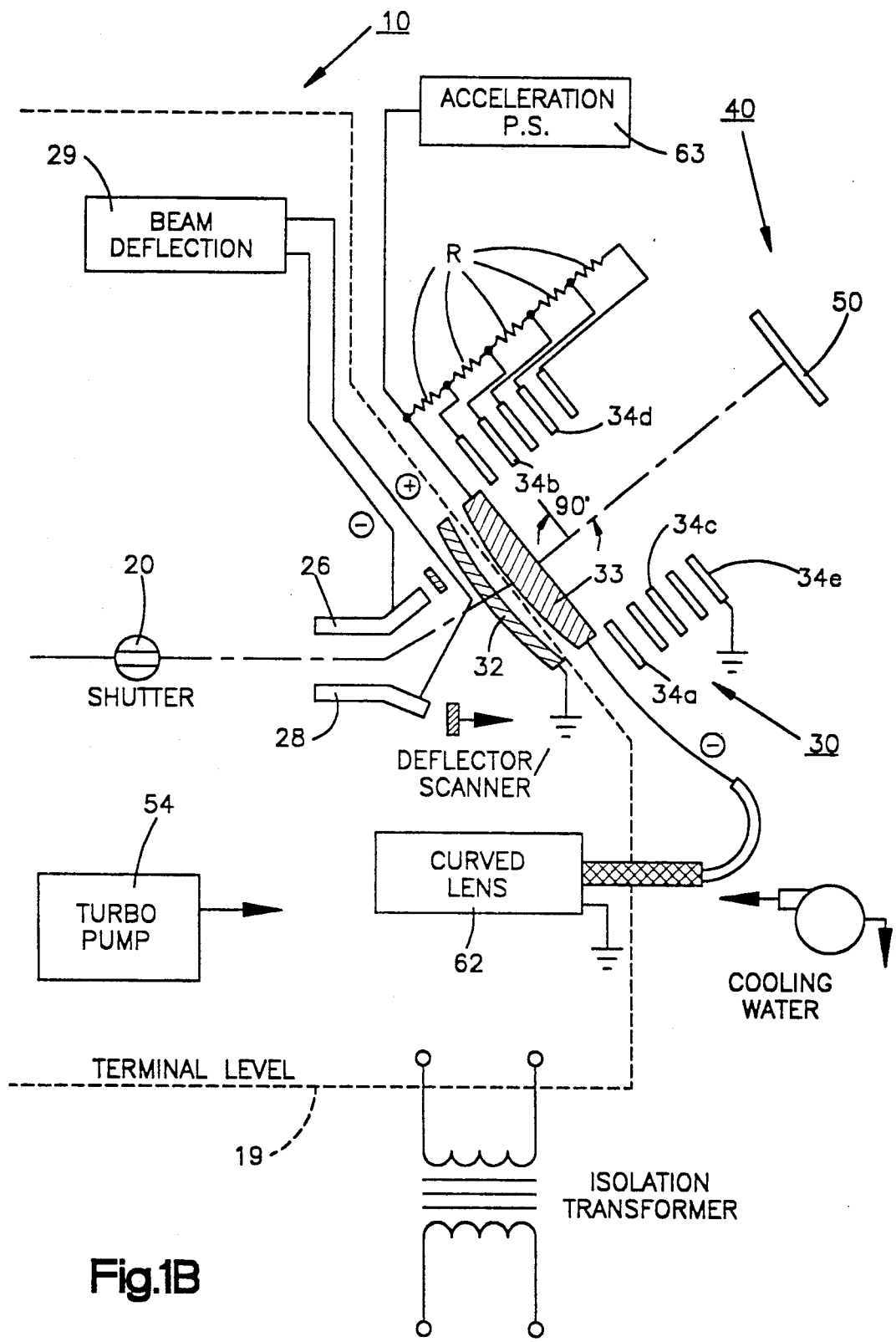

Turning now to the drawings, FIGS. 1A and 1B illustrate an ion implantation system 10 having an ion source 12 (FIG. 1A) for generating an ion beam 14. The source 12 includes a filament that emits electrons which ionize gas molecules within a source ionization chamber. The filament is activated by a filament power supply 13 which energizes the filament. An extraction power supply 15 maintains a bias between an extraction electrode 17 and the source 12 of approximately 15–40 kV. This causes ions emitted from the source 12 to accelerate and follow a trajectory that leads to an ion mass analyzing magnet 16.

The source 12 is positively biased with respect to the magnet 16. The magnet 16 bends ions having an appropriate mass to charge ratio through approximately 90 degrees to a travel path through a shutter 20. The shutter 20 rejects ions having an inappropriate mass to charge ratio from the ion beam 14.

Beam ions that pass through the shutter 20 enter a region bounded by a pair of deflection electrodes 26, 28. Voltages applied to the electrodes 26, 28 by a beam deflection circuit 29 cause the ion beam 14 to be deflected by a controlled amount. The magnitude of the voltage difference between the two plates 26, 28 controls the amount of this deflection, and by varying this voltage the circuit 29 can cause the beam to sweep across a fan-like range of trajectories.

The deflected ion beam enters a beam accelerator tube 30 where ions are again deflected, as well as accelerated. Ions following diverging trajectories due to deflection by the electrodes 26, 28 are deflected by the accelerator tube 30 to spaced, generally parallel trajectories in the scan plane.

The beam accelerator tube 30 includes first and second curved metallic entrance electrodes 32, 33 (FIG. 3) and a plurality of spaced, parallel metallic electrodes 34a–34e that create an electric field for accelerating ions in the beam. After passing through the accelerator tube 30, ions in the beam have been both redirected to a desired trajectory and accelerated to a final implantation energy.

Downstream from the acceleration tube 30, an ion implantation station 40 includes a wafer support 50 that positions a semiconductor wafer to intercept ions. Ion beam collisions with other particles degrade beam integrity so that the entire beam travel path from the source 12 to the implantation station 40 is evacuated. Two pumps 52, 54 maintain low pressure within the ion implantation system 10. At the region of the ion implantation station 40 a chamber is evacuated and the wafers are inserted into and withdrawn from load locks to avoid repeated pressurization and depressurization of the chamber. Such mechanisms are known in the prior art.

The scanning electrodes 26, 28 produce side-to-side beam scanning of a controlled amount under the direction of the beam deflection circuitry 29. This circuitry includes a programmable controller for adjusting the scanning electrode voltages to achieve this wafer scanning. The particular ion implantation system depicted in FIGS. 1A and 1B produces only side-to-side scanning so that to implant an entire workpiece surface of a circular wafer, for example, an additional relative motion between the deflected ion beam and the workpiece is necessary. In this implementation, a linear back and forth scan of the wafer support 50 (perpendicular to the plane of the ribbon ion beam) is achieved through suitable drive mechanisms (not shown) attached to a wafer support.

As seen most clearly in FIGS. 3-6, the entrance electrode 32 of the accelerator tube 30 forms an arcuate surface facing ions entering the tube. The electrode 32 is maintained at a fixed potential. A second electrode 33 is biased negatively with respect to the first electrode by a power supply 62 (FIG. 1B). The voltage difference between the first electrode 32 and the second electrode is maintained at a fixed proportion of the extraction voltage. For this geometry, the voltage difference between the first electrode and second electrode is maintained at 1.6 times the extraction voltage.

Figure 3:
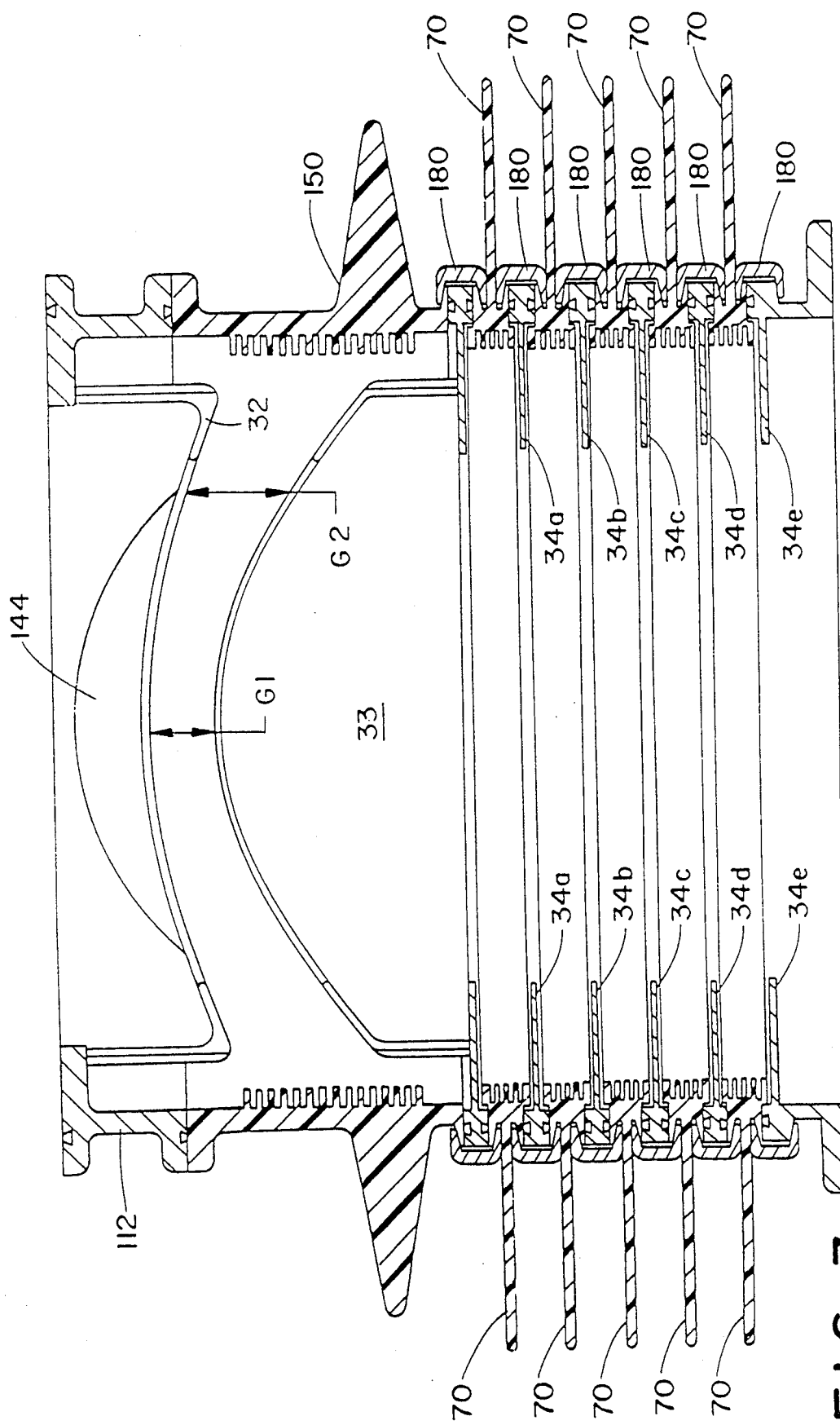
FIG. 3 is a section view of the FIG. 2 structure showing first and second curved entrance electrodes.

As seen in FIG. 3, the electrodes 34a-34e are separated by insulators 70 which electrically isolate each electrode from an adjacent electrode as well as space the electrodes relative to each other. Bias resistors R (FIG. 1B) are electrically connected between the electrodes 34a-34e and across the acceleration power supply 63 and system ground to produce approximately the same voltage difference between adjacent electrodes. Each resistor R has a resistance of approximately 250 megohms.

The electric field set up by the accelerator tube 30 redeflects ions moving in divergent paths due to the side to side scanning of the electrodes 26, 28 into paths which are generally parallel to each other in the scan plane. The redeflected ions are accelerated and exit the accelerator tube 30 having trajectories which cause the ions to impact wafers on the wafer support 50 at a relatively uniform impact angle. By appropriate orientation of the wafer support, this angle can be perpendicular or at other predetermined impact angles.

Figure 10:
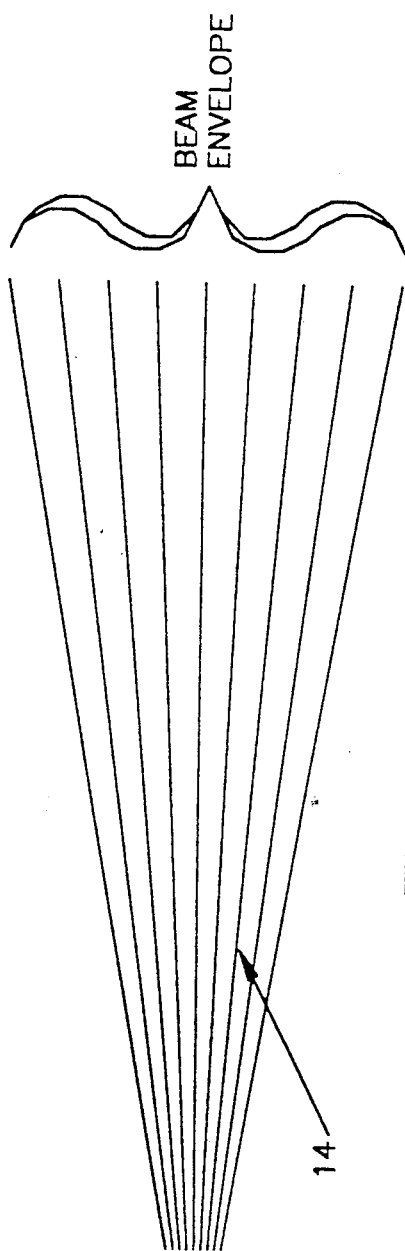
FIG. 10 is a schematic showing a spread of ion beam angles of incidence as an ion beam impacts a workpiece.

When discussing beam parallelism, the parallelism must be discussed in the context of both the average impact angle of the beam on a workpiece and the spread or deviation of that impact angle. As seen in the schematic depiction of FIG. 10, it is possible to have a mean or average impact angle of zero degrees with the workpiece but have a large variation in the impact angle across the beam width. A most desirable beam from the standpoint of semiconductor processing is one where the medium, as well as range of impact angles, does not deviate from a specific value at all conditions and points across the semiconductor wafer.

To assess the success in achievement of this goal, the angular range and medium are broken up into range and medium angles in both the cross and scan planes. The parallelizing plane is the plane of FIG. 1B. This plane is also referred to as the scan plane since it is the plane that the scan plates or electrodes 26, 28 sweep the beam back and forth through.

Figure 12:
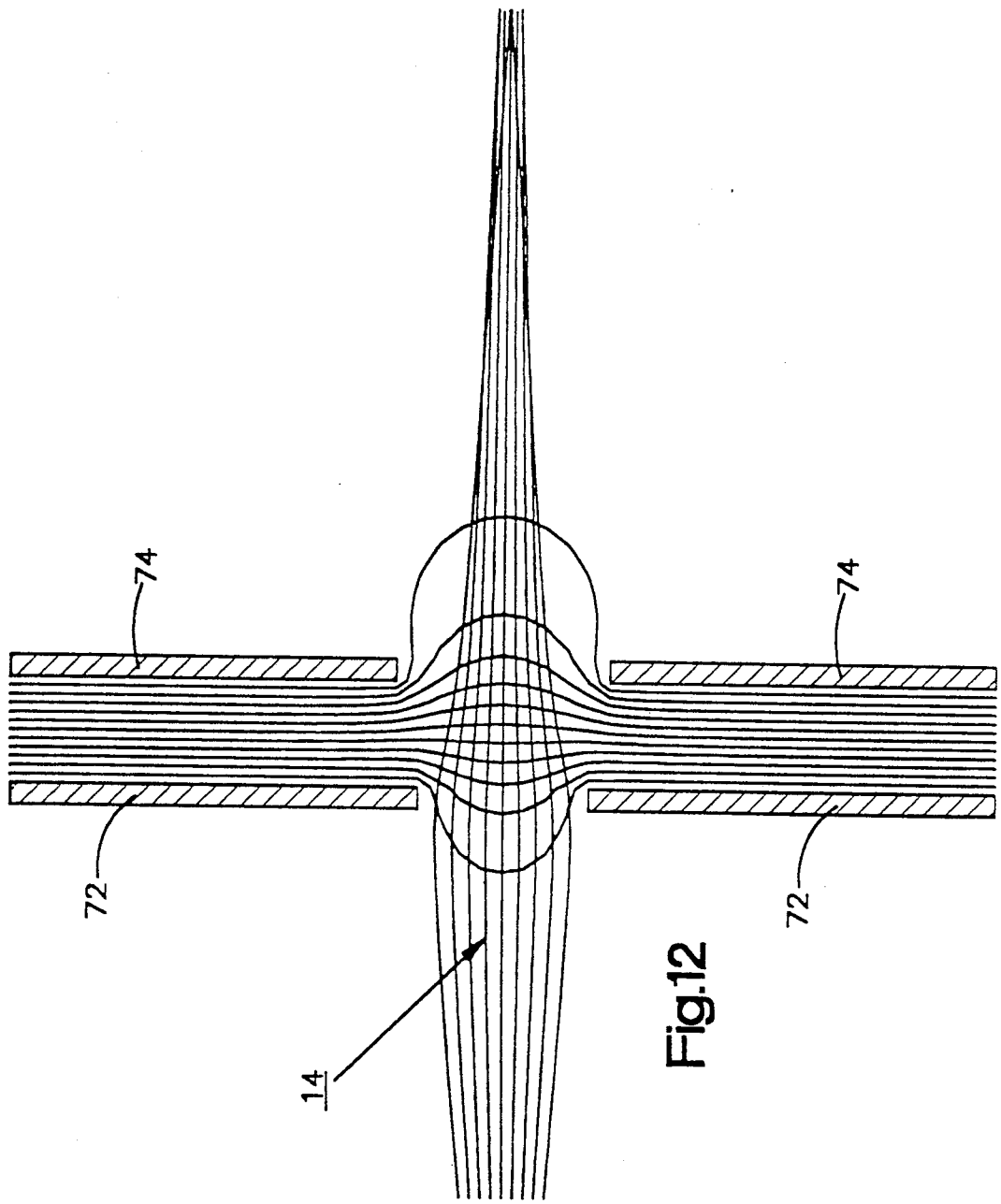
FIG. 12 is a section view taken perpendicularly through the two parallel plates of FIG. 11.

The cross plane is a plane taken through a section view of the acceleration tube such as the section view of FIG. 12. In focusing an ion beam by using an electrostatic element, one must carefully determine the shape and gradient of both the entrance and exit fields in the vicinity of the electrostatic element.

In analyzing an electrostatic element, it is convenient to divide the field into two areas, a linear field region where the equal potential lines are approximately flat, and the fringing fields where the potential lines are substantially curved or bowed. The electrostatic field imparts energy and consequently causes a velocity change to the beam in a direction that is tangent to the equal potential lines. If the fringing fields did not exist, the linear region of electric field would only accelerate or decelerate the beam in its original direction of travel and no cross plane focusing would occur. It is the bowing of the fringing fields which creates a focusing action. The desired amount of focusing is determined by considerations of all the optical elements in the beam line to provide an overall beam transport definition.

Figure 11:
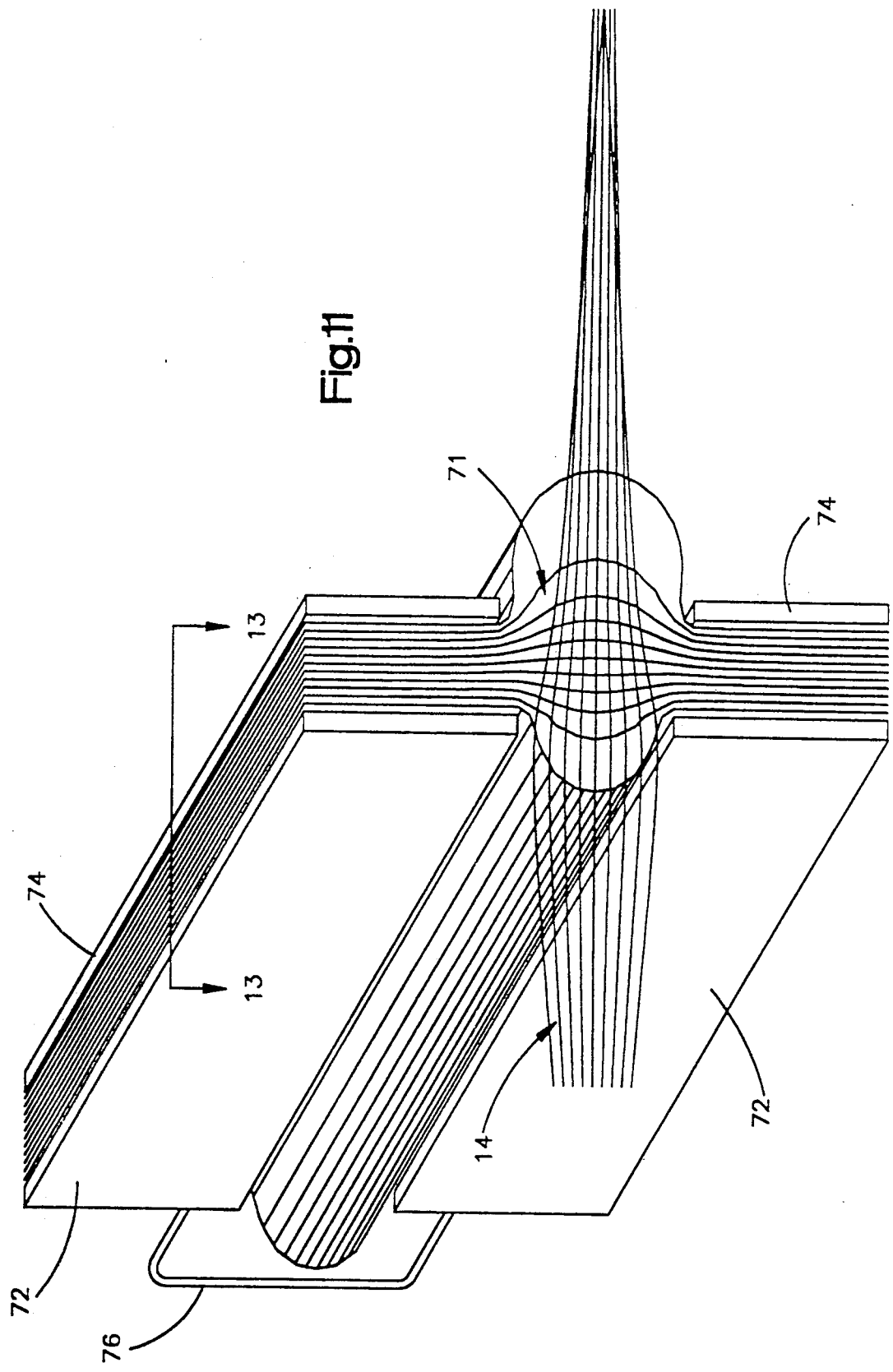
FIG. 11 is a perspective view of two elongated parallel ion-deflecting plates.

Turning now to FIG. 11, this figure depicts an acceleration gap 71 defined by two infinitely long electrodes 72, 74. Two electrode portions that make up the electrode 72 are shown electrically connected together by a conductive jumper 76. A similar conductor couples together the two portions of the conductor 74. By describing an infinitely long pair of electrodes, it is possible to ignore fringing fields at the ends of the electrodes. A diverging beam 14 entering the gap 71, can be seen to be strongly converging due to the focusing effect of the electric field. FIG. 12 is a section view, perpendicular to the electrodes in FIG. 11, showing the ion beam 14 entering the electrodes with divergent velocity components in the cross plane subsequent to their being deflected in the scanning plane by the electrodes 26, 28 and being focused by the electric field set up by the electrodes 72, 74.

Figure 13:
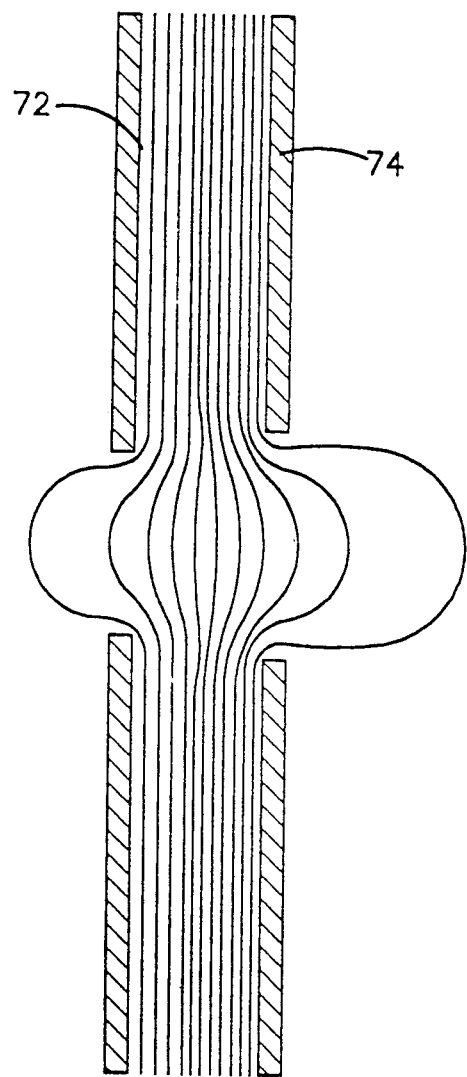
FIG. 13 is a section view taken at an oblique angle through the two parallel plates defined by the line 13—13 in FIG. 11.

When the beam 14 is injected into electrodes 72, 74 at an oblique angle, fringing and linear regions that the beam encounters have a different focusing action compared to a beam injected perpendicularly into the electrodes. This affect is illustrated by comparing the depiction of the equipotential lines in FIG. 13, which shows a view of the electrodes from the plane 13—13 in FIG. 11, to the equipotential lines seen in FIG. 12. The focusing of an electrostatic lens is seldom capable of being predicted in the form of closed from mathematic solution. Taking into account theoretical electrostatic considerations, however, an appropriate electrode construction based upon the beam geometry and the beam scanning can be modeled sufficiently accurately by a finite difference computer program. The detailed depiction of the electrodes 32, 33 discussed below is the result of one such model.

Figure 14:
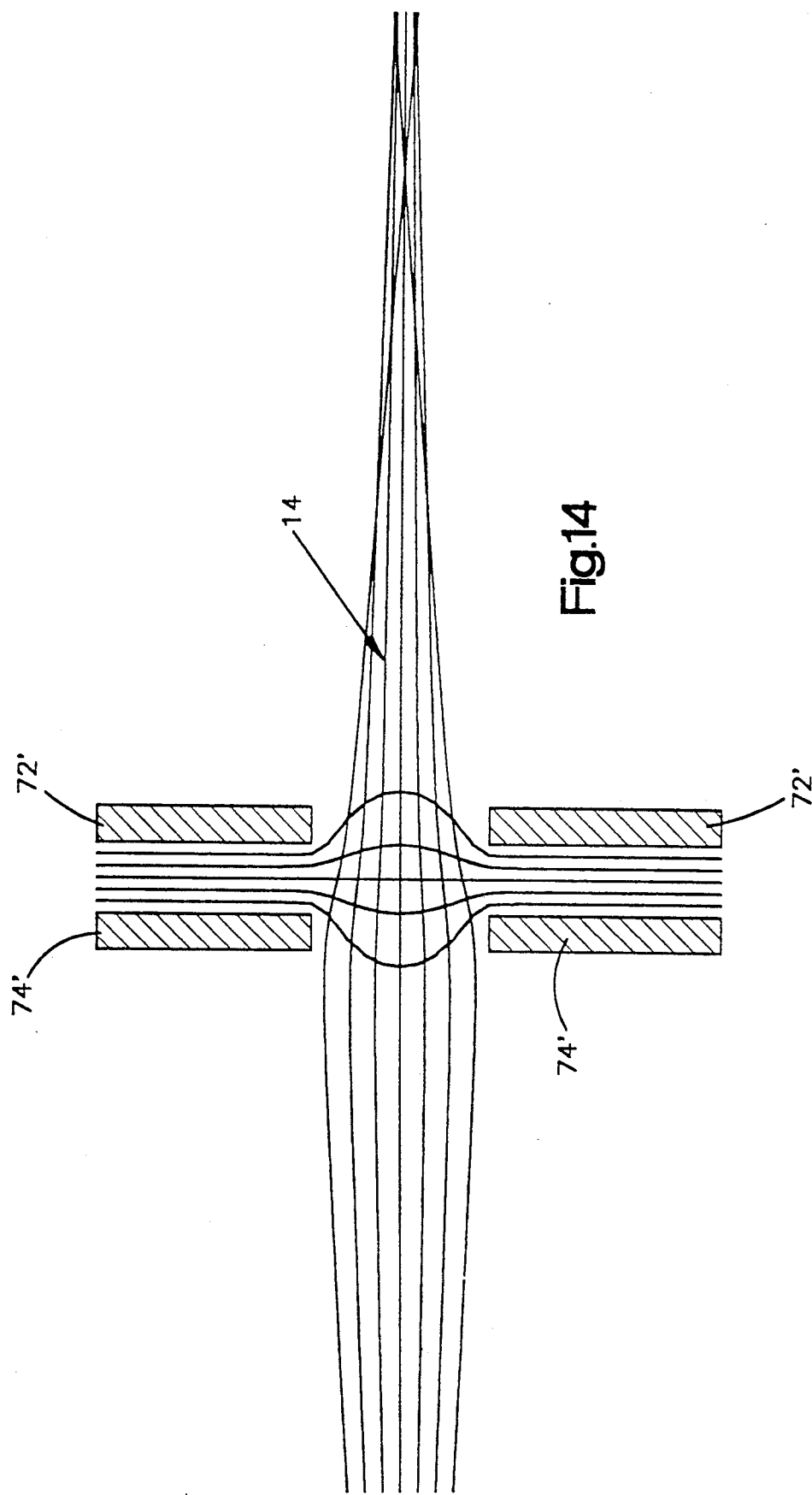
FIG. 14 is a section view of two parallel electrodes showing fringe fields between the electrodes.
Figure 15:
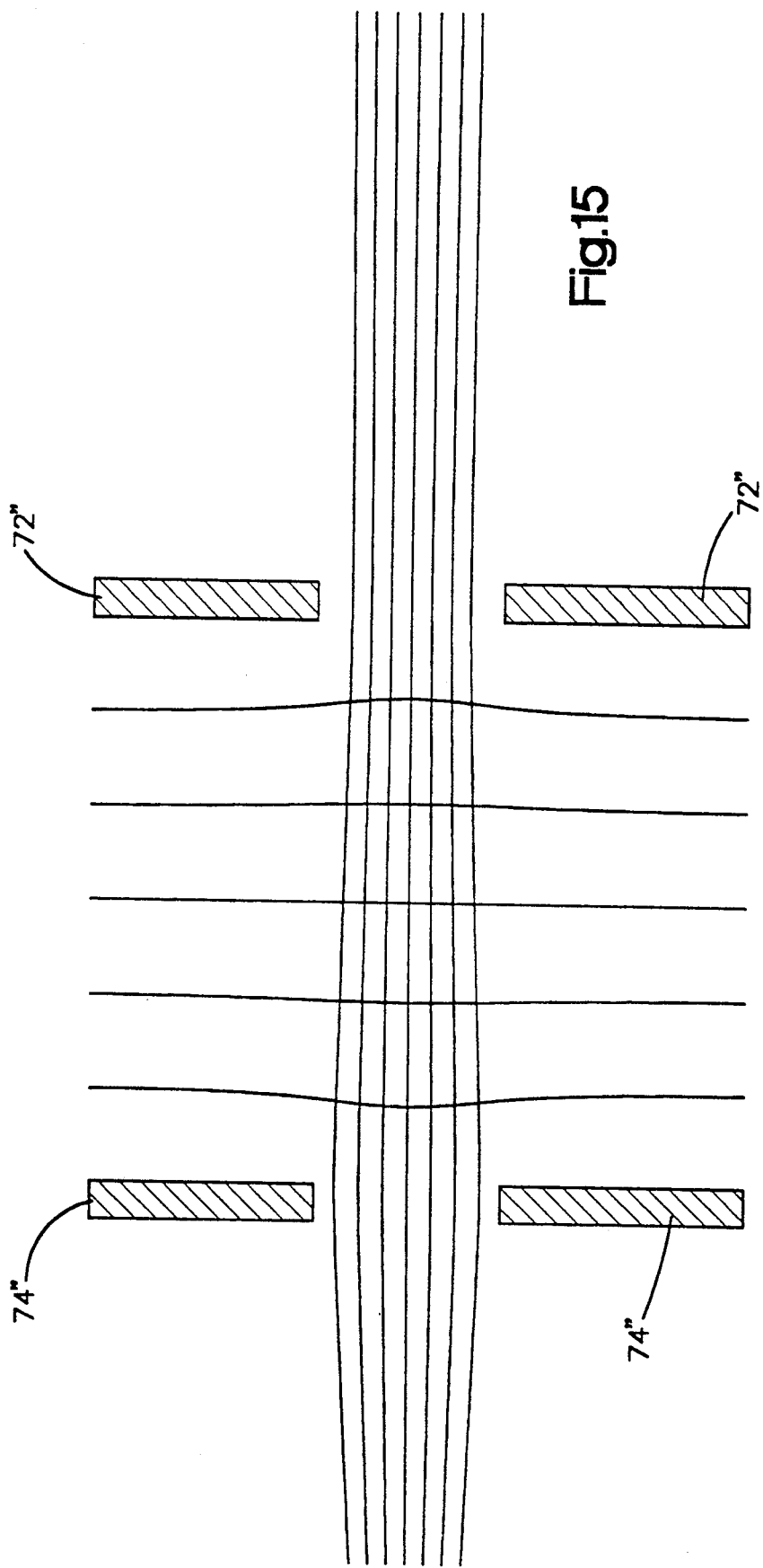
Figure 16:
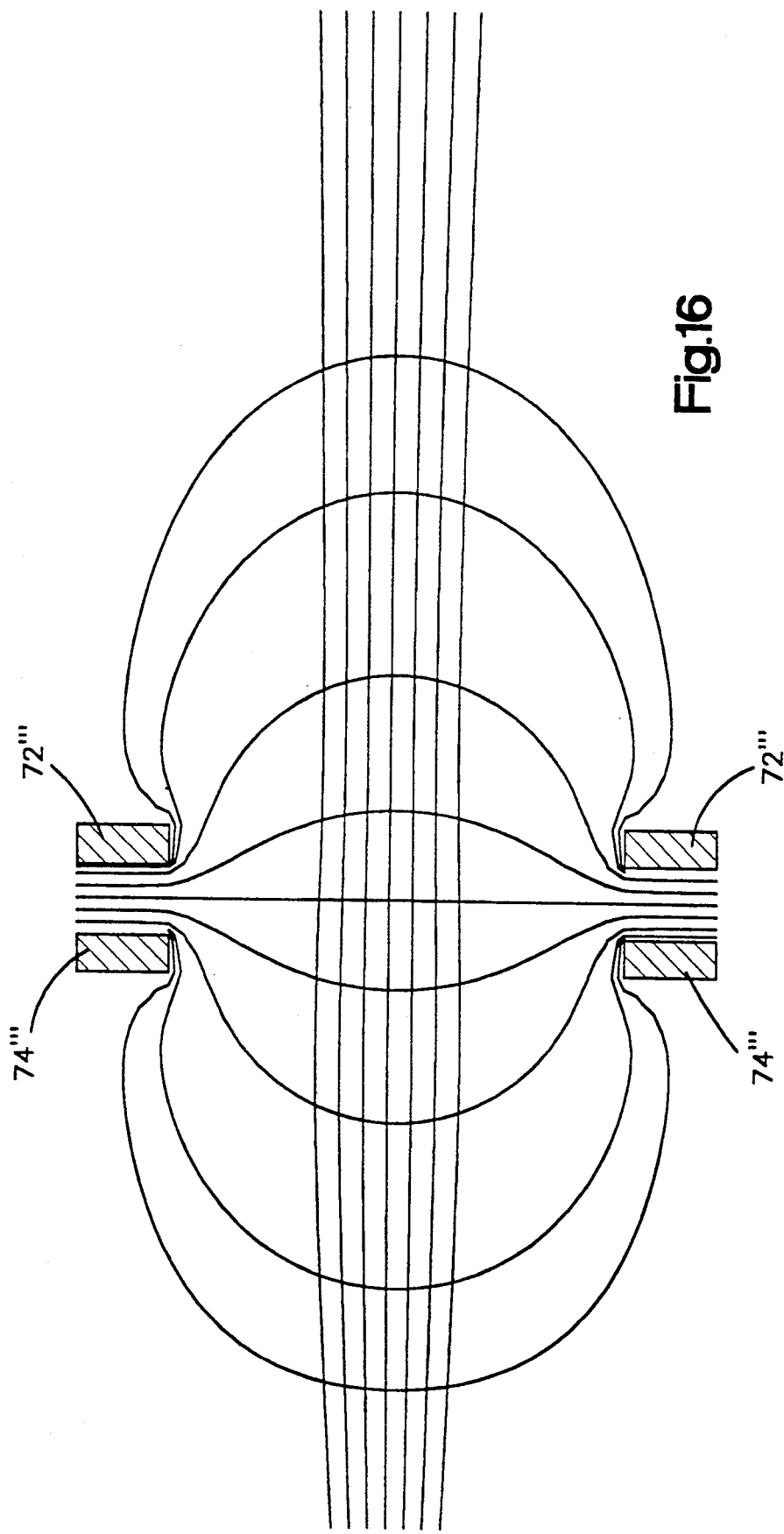

The amount of variation in the cross plane focusing depends on the curve shape of the lens and the ratio of the beam energy to lens voltage, both of which are generally selected based on parameters such as available power supplies, range of desired beam energy, and overall size of the system. FIG. 14 shows the focusing at the center of two parallel electrodes 72', 74' where the beam is injected perpendicular to the electrodes. In order to reduce the focusing variation across the lens, it is necessary to modify the fringing fields differently at points along the electrode width. To accomplish focus control, three variations have been introduced:

1. Varying the length of the acceleration gap by increasing electrode separation, FIG. 15. Increasing the width of the gap between the electrodes 72", 74", while holding the voltage constant decreases the voltage gradient in the linear region, which results in smaller fringing field.
2. Varying the opening or throughpassage in the two electrodes, FIG. 16. Although increasing the opening between spaced-apart portions of the two electrodes 72", 74" will result in a longer fringing field, the larger curvature of the field will result in the beam encountering a flatter region of the fringing field.
3. Varying the thickness of the two electrodes, FIG. 17. This is a smaller effect than items 1 and 2, however, the shape of the fringing field is affected by the thickness of the electrodes and can be advantageously used in designing the electrodes. As seen in FIG. 17, the electrode 82 is much thicker than the electrode 80.

By comparing FIG. 14 to FIG. 15, 16 and 17, one sees the relative changes that occur by varying these parameters. The mix of variations is optimized by considering a large number of parameters, including the voltage across the lens, beam energy, beam size at the entrance electrode, beam angle of incidence, curvature of the lens, and voltages on surrounding electrodes.

Figure 2:
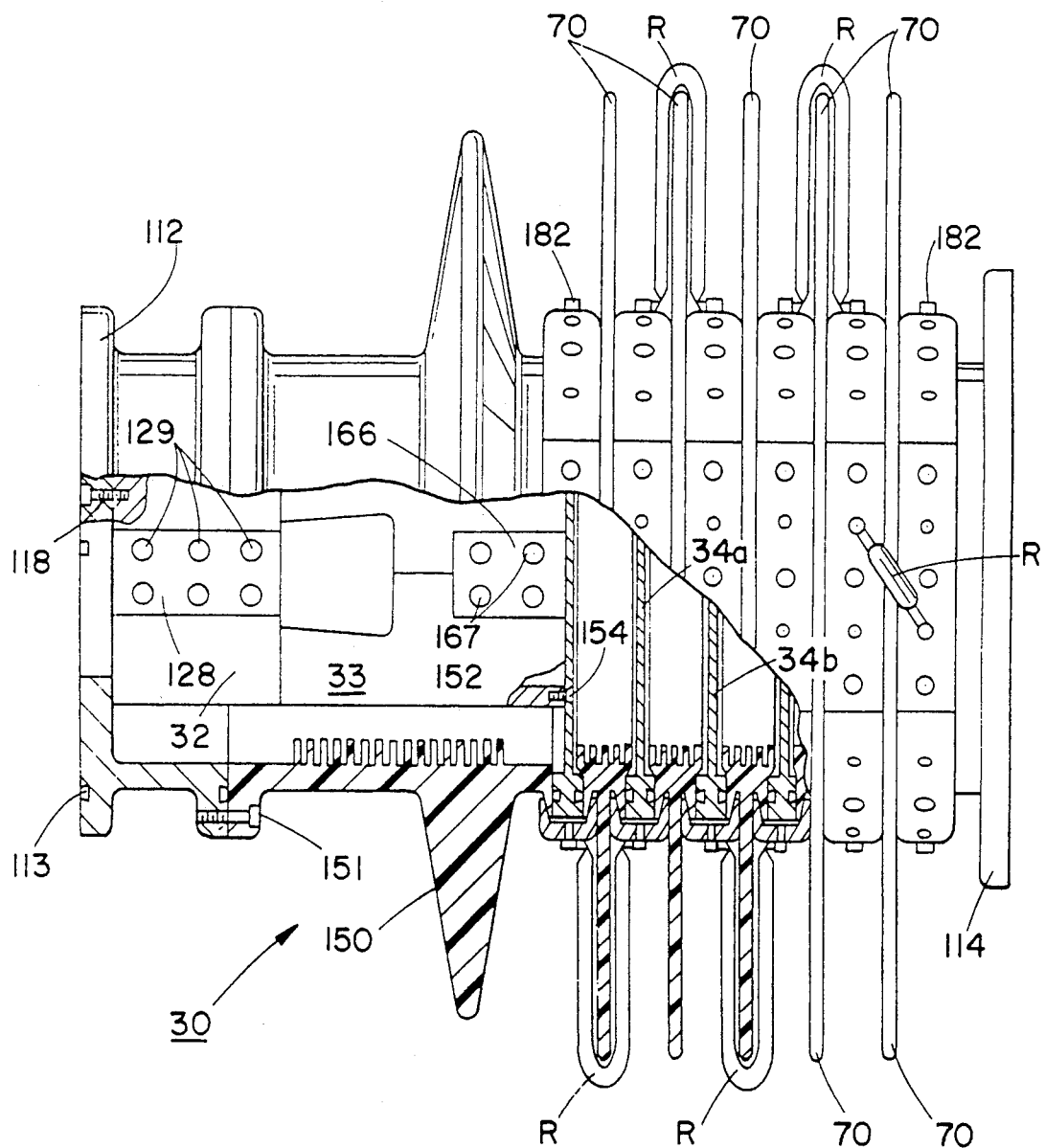
FIG. 2 is an enlarged partially sectioned view of an ion beam acceleration tube.

A more detailed depiction of the accelerator tube 30 is shown in FIGS. 2 and 3. The entrance electrode 32 is attached to a metal plate 112 that abuts an upstream portion of the beam transport structure. A fluid-tight engagement between the plate 112 and this structure is maintained by "O" rings seated within slots 113 extending around the plate 112. In a similar fashion, a metal plate 114 at an opposite end of the acceleration tube 30 engages downstream structure of the ion implantation system and maintains a fluid-tight engagement by means of similar "O"-ring seals.

The entrance electrode 32 is attached to the plate 112 by means of connectors 118 that extend through the plate 112 and into threaded openings 120 in mounting surface 122 (FIG. 4) of top and bottom walls 124, 125 of the electrode 32. As seen most clearly in FIG. 4, the electrode 32 is constructed from two symmetric metal castings that engage each other along a center line 126 of the electrode 32. The two halves of the electrode 32 are connected together by a splice plate 128 (FIG. 2). Connectors 129 extend through the splice plate 128 and engage threaded openings 130 extending through a side wall 132 of the electrode 32.

Figure 5:
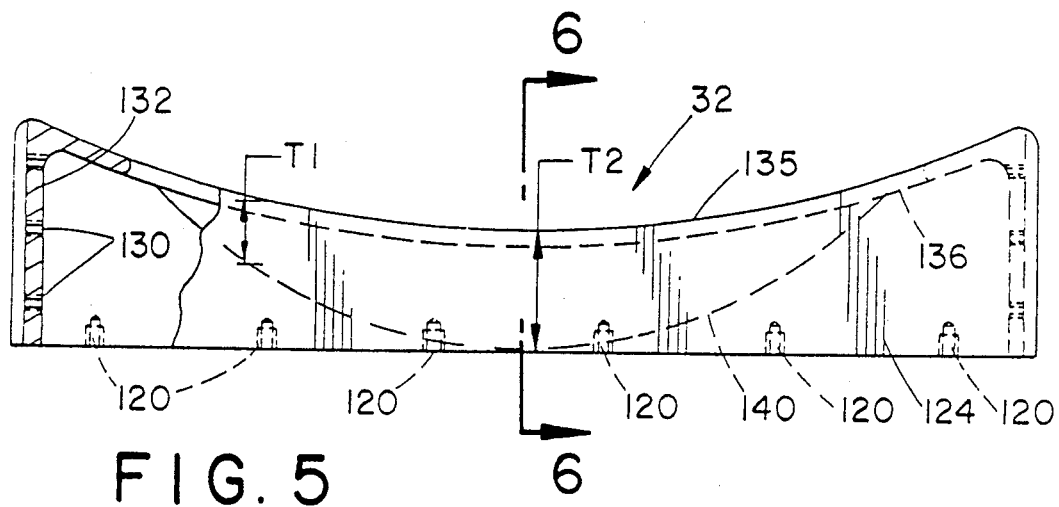
FIG. 5 is a partially section plan view of the FIG. 4 curved entrance electrode.
Figure 4:
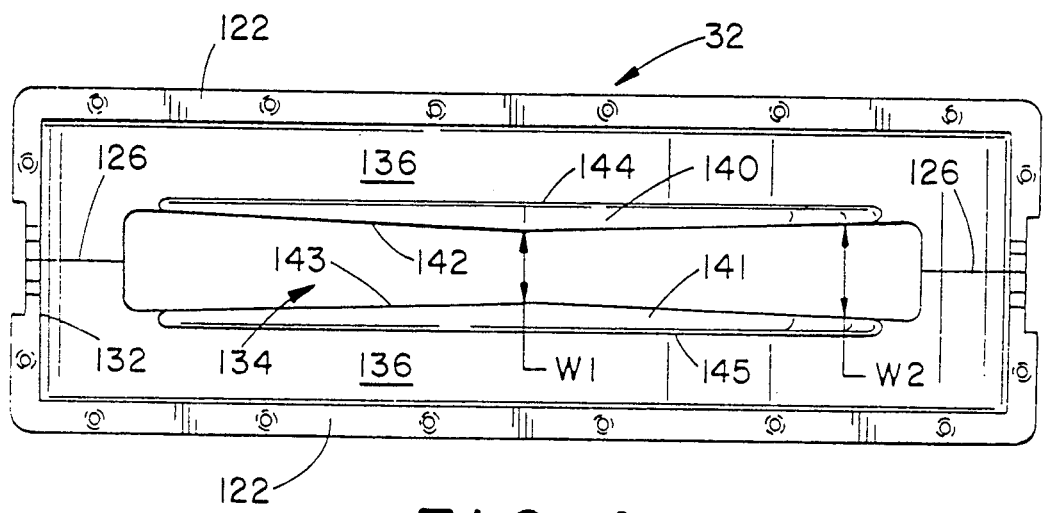
FIG. 4 is an elevation view of one of two curved entrance electrodes of the FIG. 2 ion beam acceleration tube.
Figure 6:
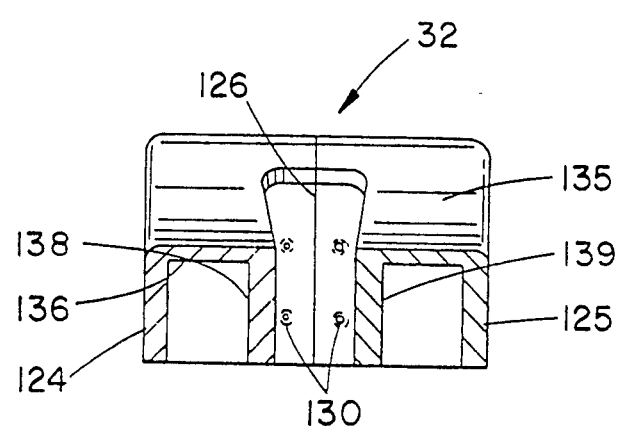
FIG. 6 is a section view of the entrance electrode as seen from the plane 6—6 defined in FIG. 5.
Figure 8:
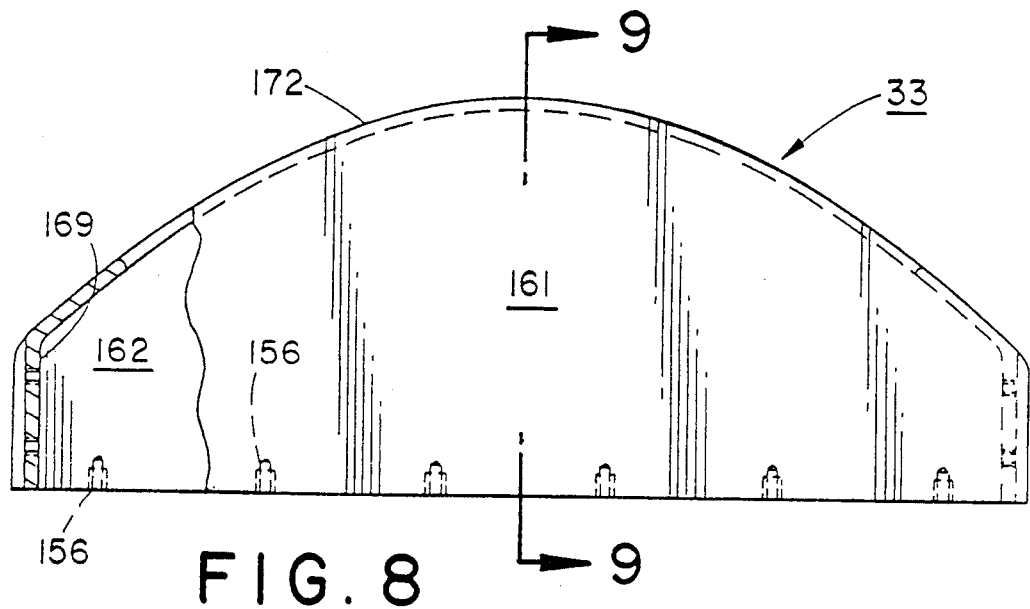
FIG. 8 is a partially sectioned plan view of the FIG. 7 electrode.

The electrode 32 defines a slot or throughpassage 134 that is elongated to accommodate the side-to-side scanning imposed on ions within the beam by the two deflection electrodes 26, 28. The slot 134 has a greater width W2 at its sides than in its middle where the slot has a width W1 of approximately 1.31 inches. As seen in FIG. 5 and 6, the electrode 32 includes a curved wall 135 having a curved surface 136 extending across the electrode 32 that surrounds the gap or throughpassage 134. Extending perpendicularly away from this curved surface 136 are upper and lower metal plates 138, 139 having curved edges 140, 141. The metal plates 138, 139 have contoured, inwardly facing surfaces 142, 143 conforming to the shape of the slot in the surface 136 and generally planar, outwardly facing surfaces 144, 145. The plates 138, 139 vary the thickness of the electrode 32 across the slot length. Two representative thicknesses T1, T2 are shown in FIG. 5.

An insulator 150 abuts the plate 112 to which the electrode 32 is attached and spaces this electrode from the second curved electrode 33. This insulator 150 is preferably constructed from cast epoxy. Connectors 151 (FIG. 2) pass through the insulator 150 to engage the plate 112.

Figure 7:
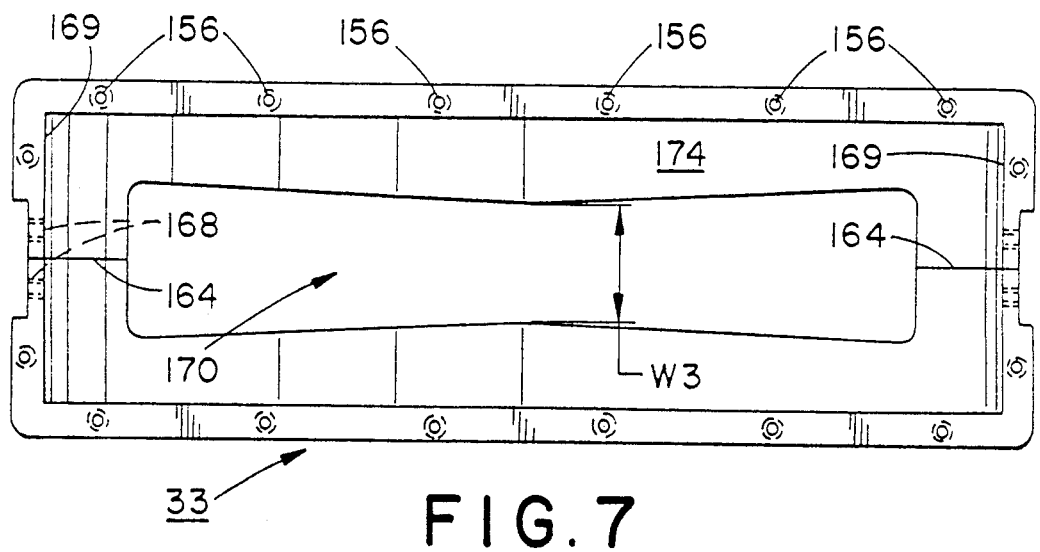
FIG. 7 is an elevation view of a second of two curved entrance electrodes of the FIG. 2 ion beam electrode structure.
Figure 9:
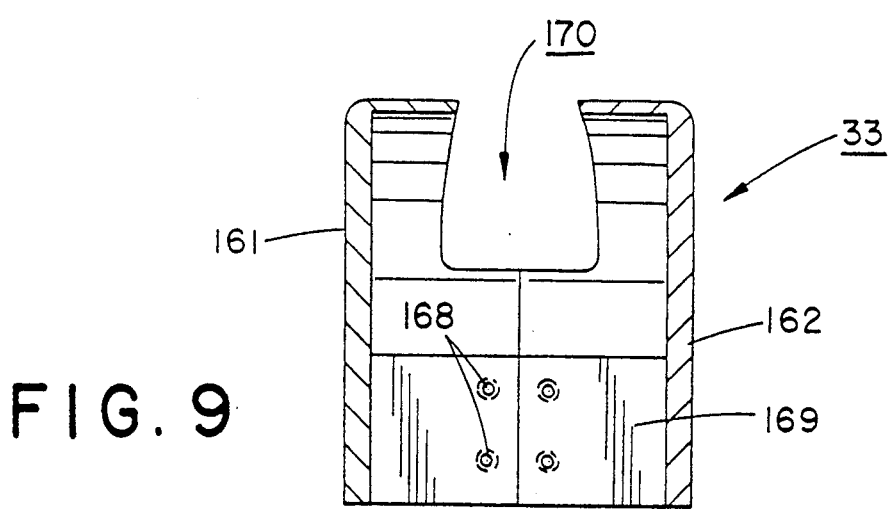
FIG. 9 is a sectioned view of the second entrance electrode as seen from the plane 9—9 in FIG. 8.

A conductive plate 152 similar in construction to the electrodes 34a-34e abuts the insulator 150. The plate 152 supports the second arcuate electrode 33. Threaded connectors 154 extend through the plate 152 and engage corresponding threaded openings 156 in a mounting face 160 of top and bottom walls 161, 162 of the electrode 33. As seen most clearly in FIG. 7, the electrode 33 is also constructed from two portions which engage each other along a center line 164 and are held together by two splice plates 166. Connectors 167 extend through the plate 166 and engage threaded openings 168 in side walls 169 of the electrode 33.

The electrode 33 defines a throughpassage 170 having the same shape as the throughpassage 134 in the electrode 32. More specifically, the throughpassage 170 in the electrode 33 narrows at its center and widens on its two sides. A width W3 of the center of the gap is approximately 2.10 inches. A curved surface 172 of a curved electrode entrance wall 174 conforms generally to the curved edges 140, 141 on the electrode 32. Turning now to FIG. 3, it is that the spacing between the electrodes 32, 33 varies across the length of the slot through the electrodes. Representative gaps G1, G2 are depicted in FIG. 3.

The insulators 70 are cast epoxy members that extend radially outward from the accelerator tube. This radial extension inhibits arcing between adjacent electrodes 34a-34e. The resistors R are formed by insulated resistor elements that loop around the insulators 70. The electrodes 34a-34e are held in place by metal caps 180 that engage the insulators 70 and define openings through which connectors 182 are inserted to threadingly engage the electrodes 34a-34e.

The invention has been described in conjunction with a preferred embodiment of the invention. Although the preferred ion implanter is depicted having voltage polarities suitable for implanting positive ions, a system for implanting negative ions or electrons is possible. It is also possible to use a deceleration tube to focus ions in an ion beam. Such a tube would slow down rather than accelerate ions while narrowing the range of impact angles. It is the intent that the invention include all modifications and alterations from these embodiments falling within the spirit or scope of the appended claims.

We claim:

1. An ion beam implant system for controllably treating a workpiece comprising:
   a) source means for providing ions to treat a workpiece;
   b) support means for orienting the workpiece at a location relative the source means;
   c) beam forming means for causing ions emitted by the source means to follow an initial trajectory;
   d) electrode means fro deflecting ions in said ion beam away from said initial trajectory by a controlled amount;
   e) lens means for again deflecting ions prior to said ions impacting the workpiece comprising first and second spaced electrodes that define first and second elongated slots for allowing ions to enter a spatially non-uniform electric field that causes ions following diverse trajectories after deflection by the electrode means to be redeflected and impact the workpiece at a relatively uniform angle; and
   f) control means having an output coupled to said electrode means to adjust the deflecting of said ion beam and thereby control ion beam treatment of the workpiece;
   g) the first and second elongated slots varying in width from a center region of the first and second slots to an outer portion of said first and second slots.

2. The ion implant system of claim 1 wherein the first and second electrodes have curved electrode surfaces that vary in thickness in a region bounding the elongated slots through which the ion beam passes on its way to the workpiece.

3. The ion implant system of claim 1 comprising at least two additional electrodes, wherein said additional electrodes are spaced, parallel electrode plates having apertures for transmitting ions passing through the aperture in the arcuate electrode to the workpiece.

4. The ion implant system of claim 1 where the curved surfaces of the spaced first and second electrodes have differing curvature to vary a gap separation between the curved surfaces along the length of the first and second slots.

5. The ion implant system of claim 1 additionally comprising a lens power supply for biasing the first and second electrodes at different constant electric potentials for creating a static electric field in a region between the first and second electrodes.

6. For use with an ion beam implant system, an ion accelerator comprising:
   a) first and second entrance electrodes biased at voltages for creating a non-uniform electric field that causes ions following diverse trajectories within said implant system to be deflected and impact a workpiece at a relatively uniform angle; said electrodes defining elongated slots extending therethrough that are generally symmetric about a plane passing through said first and second entrance electrodes and wherein the slots have a width that varies across the length of the slots;
   b) a plurality of additional spaced electrodes for accelerating said ions to an impact energy before striking the workpiece;
   c) a plurality of insulators separating said electrodes; and
   d) a power supply for electrically biasing the first and second entrance electrodes at electric potentials different from the plurality of additional electrodes to create the non-uniform electric field and for electrically biasing the plurality of additional spaced electrodes for accelerating the ions.

7. The ion accelerator of claim 6 wherein a slot width is less at a center of the slot and widens at positions removed from the center.

8. The ion accelerator of claim 7 where the slot widens uniformly on opposite sides of the slot.

9. The ion accelerator of claim 6 where the first and second entrance electrodes have curved surfaces that are spaced apart by a variable gap along the length of said elongated slots.

10. The ion accelerator of claim 6 where a thickness of at least one of said first and second entrance electrodes changes along a length of said elongated slots.

11. An ion beam implant system for controllably treating a workpiece comprising:
   a) source means for providing ions to treat the workpiece;
   b) support means for orienting the workpiece at a location relative the source means;
   c) beam forming means for causing ions emitted by the source means to form an ion beam moving in a first trajectory;
   d) electrode means for deflecting ions in said ion beam away from said first trajectory by a controlled amount;
   e) acceleration means for accelerating ions deflected by said controlled amounts prior to said ions impacting the workpiece; and
   f) control means having an output coupled to said electrode means to adjust the deflecting of said ion beam and thereby control ion beam treatment of the workpiece;
   g) said accelerator means comprising:
      i) first and second arcuate entrance electrodes defining throughpassages symmetric about a centerline that are wider at locations spaced from the centerline than at the centerline for creating a non-uniform electric field that causes ions following diverse trajectories after passing the electrode means to be redeflected and impact the workpiece at a relatively uniform angle;
      ii) a plurality of additional, spaced, parallel electrode plates for accelerating said ions to an impact energy;
      iii) a plurality of insulators separating said plates; and,
      iv) power supply means for biasing said arcuate entrance electrode relative said plurality of parallel electrode plates wherein a first of the additional electrodes is maintained at a fixed voltage by a high voltage power supply, a second of the additional electrodes is grounded and the entrance electrode is biased by a lens power supply at a voltage higher than the first additional electrode wherein positively charged ions are accelerated to a controlled ion energy when striking the workpiece.

12. A method for ion beam implanting a workpiece comprising the steps of:
   a) causing a beam of ions to move along an initial trajectory;
   b) orienting the workpiece at a target location;
   c) causing ions to diverge away from the initial trajectory to scan in a back and forth manner to form a narrow ion beam having an extent at least as wide as the workpiece;
   d) redeflecting said ions by generating a static electric field that both redeflects and accelerates ions after the divergence of the beam in both a parallelizing plane and cross plane orthogonal to the parallelizing plane; and
   e) moving the workpiece in a back and forth manner to cause ions passing through the static electric field to treat an entire workpiece surface.

13. The method of claim 11 wherein the step of generating the static electric field is performed by biasing first and second arcuate metallic electrodes relative to each other at a location downstream from the region ions diverge from the initial trajectory so that ions enter an elongated aperture in the first arcuate electrode, are deflected by the static electric field that is non-uniform due to spacing variations between the first and second arcuate electrodes, and pass through an aperture in the second electrode before striking the workpiece.

14. An ion beam implant system for controllably treating a workpiece comprising:
   a) source means for providing ions to treat the workpiece;
   b) support means for orienting the workpiece at a location relative the source means;
   c) beam forming means for causing ions emitted by the source means to form an ion beam moving in a first trajectory;
   d) electrode means for deflecting ions in said ion beam away from said first trajectory by a controlled amount;
   e) lens means for again deflecting ions prior to said ions impacting the workpiece comprising first and second spaced electrodes that define first and second elongated slots for allowing ions to enter a spatially non-uniform electric field that causes ions following diverse trajectories to be redeflected and impact the workpiece at a relatively uniform angle; and f) control means having an output coupled to said electrode means to adjust the deflecting of said ion beam and thereby control ion beam treatment of the workpiece;

g) at least one of the first and second electrodes having a thickness that changes along the length of the elongated slots.

15. The ion beam implant system of claim 14 where the first and second spaced electrodes have first and second arcuate surfaces that are spaced apart by a gap spacing that varies across the length of the elongated slots.

16. An ion beam implant system for controllably treating a workpiece comprising:

a) source means for providing ions to treat the workpiece;

b) support means for orienting the workpiece at a location relative the source means;

c) beam forming means for causing ions emitted by the source means to form an ion beam moving in a first trajectory;

d) electrode means for deflecting ions in said ion beam away from said first trajectory by a controlled amount;

e) lens means for again deflecting ions prior to said ions impacting the workpiece comprising first and second spaced electrodes that define first and second elongated slots for allowing ions to enter a spatially non-uniform electric field that causes ions following diverse trajectories to be redeflected and impact the workpiece at a relatively uniform angle; and f) control means having an output coupled to said electrode means to adjust the deflecting of said ion beam and thereby control ion beam treatment of the workpiece;

g) first and second electrodes having curved surfaces separated by a gap that changes along the length of the elongated slots.

* * * * *